Figure 1:
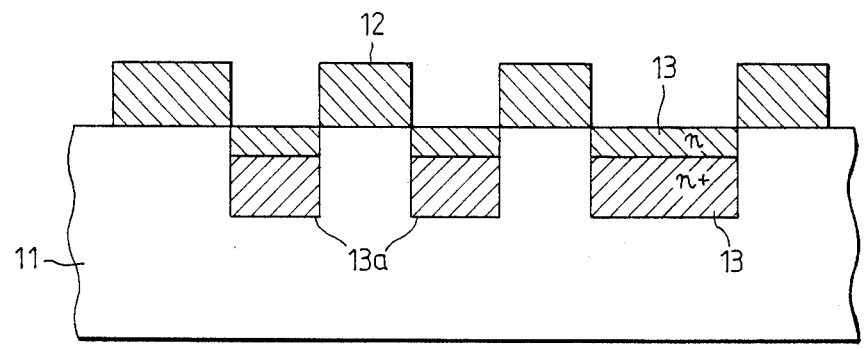
Figure 2:
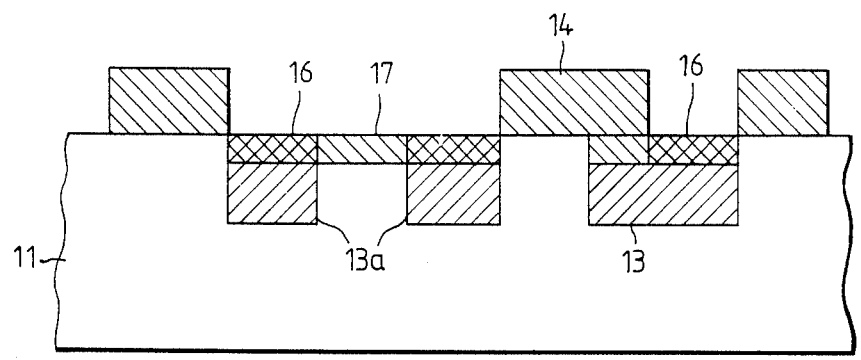

United States Patent [19]

Mun et al.

[11] Patent Number: 4,745,445

[45] Date of Patent: May 17, 1988

[54] INTERDIGITATED SCHOTTKY DIODE

[75] Inventors: Joseph Mun; Graeme K. Barker, both of Essex; Mohamed H. Badawi, Stansted, all of England

[73] Assignee: ITT Gallium Arsenide Technology Center, a Division of ITT Corporation, Roanoke, Va.

[21] Appl. No.: 945,244

[22] Filed: Dec. 22, 1986

Related U.S. Application Data

[63] Continuation of Ser. No. 587,350, Mar. 8, 1984, abandoned.

[30] Foreign Application Priority Data

Mar. 15, 1983 [GB] United Kingdom ................ 8307145
May 19, 1983 [GB] United Kingdom ................ 8313853

[51] Int. Cl.$^4$ ........................................... H01L 29/48
[52] U.S. Cl. ........................................ 357/15; 357/22; 357/68
[58] Field of Search ............... 357/16, 22, 22.5, 22 H, 357/15, 15.5, 15 P, 15 PG, 56, 68

[56] References Cited

U.S. PATENT DOCUMENTS

| 3,896,473 | 7/1975 | Di Lorenzo et al. | 357/56 |
| 4,212,022 | 7/1980 | Beneking | 357/15 |
| 4,238,763 | 12/1980 | Gray et al. | 357/15 |
| 4,338,616 | 7/1982 | Bol | 357/22 |
| 4,400,713 | 8/1983 | Bauge et al. | 357/15 |
| 4,463,322 | 7/1984 | Scott et al. | 357/22 H |
| 4,641,174 | 2/1987 | Baliga | 357/15 |

FOREIGN PATENT DOCUMENTS

| 78679 | 5/1983 | European Pat. Off. | 357/15 |
| 53-18974 | 2/1978 | Japan | 357/15 PG |
| 56-140667 | 11/1981 | Japan | 357/22.5 |
| 1180186 | 2/1970 | United Kingdom | 357/22.5 |

OTHER PUBLICATIONS

"GaAs on Sapphire," Electronics, vol. 41, #14, Jul. 8, 1968, pp. 51, 52.
A. Burkitt, "Solid-State Progress in Ckts. and Dev.," Electronic Engineering, Oct. 1975, pp. 50-52.
M. Das et al., "Two-Layer Microwave FET . . . ," IEEE Trans. on Elec. Dev., vol. ED-24, #6, Jun. 1977, pp. 757-761.
R. Van Tuyl et al., "GaAs MESFET Logic with 4-GHZ Clock Rate," IEEE J. OFS-S Ckts, vol. SC-12, #5, Oct. 1977, pp. 485-496.
D. Jados, "Buried Field Effect Trans.," IBM Tech. Discl. Bull., vol. 13, #6, Nov. 1970, pp. 1431-1432.
H. Matino, "Microwave GaAs Schottky Gate FET," Electr. & Comm. in Japan, vol. 56-C, #7, 1973, pp. 90-96.
M. Fukuta et al., "Power GaAs MESFET w. High Draw-Source Break Volt.," IEEE Trans. on Microwave Theory & Tech., vol. MTT-24, #6, Jun. 1976, pp. 312-317.

Primary Examiner—Joseph E. Clawson, Jr.
Attorney, Agent, or Firm—Robert A. Walsh; Thomas N. Twomey; Mary C. Werner

[57] ABSTRACT

A high frequency, e.g. millimeter wave, semiconductor diode structure includes a buried layer of n+-type material and a surface layer of lightly doped n-type material on which a Schottky barrier contact is disposed. The n+-type layer provides a low series resistance thus permitting high frequency operation. The structure is compatible with MESFET processing techniques and may thus be incorporated in an integrated circuit.

5 Claims, 2 Drawing Sheets

INTERDIGITATED SCHOTTKY DIODE

This application is a continuation of application Ser. No. 587,350 filed Mar. 8, 1984, now abandoned.

This invention relates to semiconductor diodes, and in particular to integrable, low resistance Schottky diodes capable of operation at millimeter wave frequencies.

With the increasing use of millimeter wave frequency circuits, e.g. for telecommunications application, there is a need for mixer diode structures capable of efficient operation at these frequencies. Conventional devices suffer from the disadvantage of a relatively high series resistance and/or a relatively high parasitic capacitance both of which can seriously impair high frequency operation.

A number of attempts have been made to provide diode structures which overcome these disadvantages, but none of these structures is readily compatible with the MESFET processing techniques that are currently employed in the fabrication of millimetre wave frequency integrated circuits.

The object of the present invention is to minimise or to overcome these disadvantages.

According to one aspect of the invention there is provided a Schottky diode structure formed in a compound semiconductor substrate, the diode structure including a buried layer of n+-type material overlaod by a surface layer of lightly doped n-type material, a Schottky contact disposed on said surface layer, and an ohmic contact provided to said buried layer.

According to another aspect of the invention there is provided a millimetre wave frequency integrated circuit comprising a Schottky field effect transistor (MESFET) and a Schottky diode structure formed in a compound semiconductor substrate, the circuit including a buried layer of n+ type material overlaid by a surface layer of lightly doped n-type material, a schottky diode contact and a Schottky gate contact disposed on said surface layer, and first, second and third ohmic contacts provided to said buried layer and comprising respectively the ohmic contact of the diode and the source and the drain contacts of the MESFET.

According to a further aspect of the invention there is provided a method fabricating a semiconductor structure including a Schottky diode in a commpound semiconductor substrate, the method including selectively implanting high energy ions into the substrate to form a buried layer of n+-type material, said buried layer defining a lightly doped surface layer, selectively implanting said surface layer to form a conductive region contiguous with said buried layer, applying an ohmic contact to said conductive region, and applying a Schottky barrier contact to a remaining, undoped region of the surface layer.

Typically the compound semiconductor material is gallium arsenide as this material has a band gap and carrier mobility suitable for high frequency generation. The preferred fabrication technique uses a high energy implantation of doubly charged n-dopant ions, e.g. silicon, to selectively form a highly doped buried n+-type layer beneath a relatively lightly doped surface layer on which the diode Schottky contact is then formed. A second lower energy implantation is then carried out to raise the surface doping in the appropriate area where the ohmic contact is to be formed. Advantageously, by selectively implanting the buried layer, a structure of low parasitic resistance is achieved and consequently an improved high frequency performance is obtained. The technique is compatible with current MESFET processing and is thus particularly suited to the fabrication of millimeter wave frequency integrated circuits.

Figure 4:
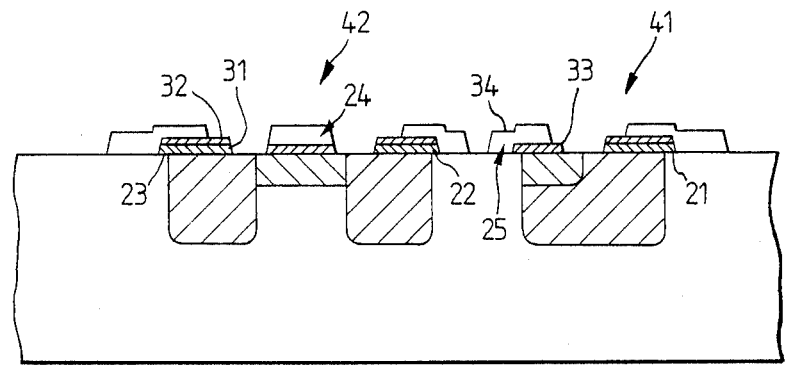
Figure 5:
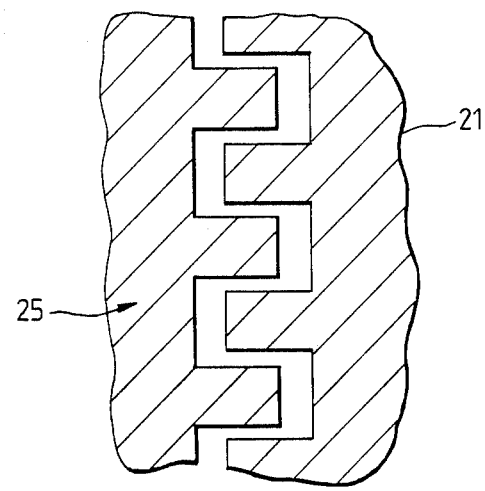

An embodiment of the invention will now be described with reference to the accompanying drawings in which:

FIGS. 1 to 4 are cross-sectional views illustrating the fabrication sequence of a semiconductor structure incorporating a Schottky diode;

and FIG. 5 is a plan view of the Schottky diode of FIG. 4.

The Schottky diode is formed in a compound semiconductor substrate, advantageously as part of an integrated circuit. For illustration pruposes only the fabrication of a diode and an adjacent transistor (MESFET) is shown.

Referring to FIGS. 1 to 4, a compound semiconductor substrate 11 (FIG. 1) is provided with a mask 12 and is then exposed to a high energy beam of dopant ions to form a buried n+-type layer comprising regions 13 and 13a. Typically the substrate comprises gallium arsenide (GaAs) and the dopant comprises silicon. Silicon is preferred for its large penetration range. For example, with doubly charged silicon ions and an acceleration voltage of 200 volts, equivalent to 400 keV energy a mean penetration of 0.5 to 0.6 microns can be achieved in a gallium arsenide substrate. Under such conditions we have found that a buried peak doping level of $10^{18}$ silicon atoms/cc can be obtained with a dose of $10^{14}$ ions/cm$^2$, with a surface doping in the region of $10^{17}$/cc. Such a layer is fully depleted by a Schottky barrier contact. In practice it is difficult to achieve doping levels above $2\times10^{18}$ atoms/cc.

As the n+-type layer is buried it is separated from the semiconductor surface by a relatively lightly doped surface layer 15. The thickness of this surface layer is of course a function of the implantation energy and is typically 0.1 to 0.2 microns.

After implantation of the buried layer 13 the mask 12 is removed and a second mask 14 (FIG. 2) is applied. A lower energy and lower dosage implantation, e.g. of silicon at 80 keV and $4\times10^{12}$/cc, is then effected to raise the doping level of the surface layer 15 in those regions 16 where ohmic contacts are to be formed. At the same time this doping defines the channel 17 of the field effect transistor.

Figure 3:
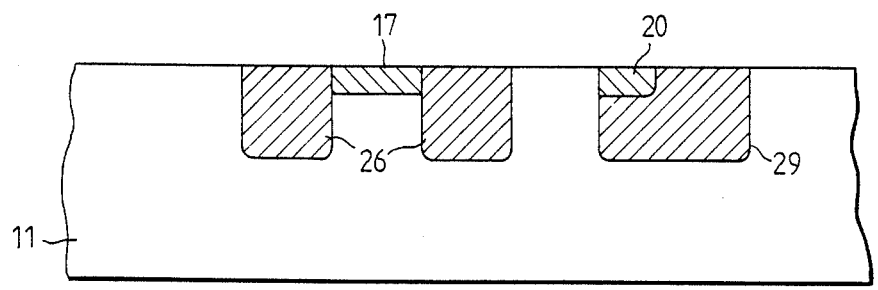

The mask 14 is removed and the structure is annealed to activate the implanted area. This provides a structure as shown in FIG. 3 comprising a pair of heavily doped n+-type regions 26 separated by a thin lightly doped n-type region 17, and a further n+-type region 29 having a lightly doped n-type surface region 20.

Ohmic contacts 21, 22 and 23 (FIG. 4) are next applied to the n+-type regions to provide respectively the ohmic contact of a Schottky barrier diode 41 and the source and drain contacts of a MESFET 42. Typically these contacts comprise a lower layer 31 of a gold/germainium alloy and an upper layer 32 of nickel.

Schottky barrier contacts 24, 25, typically comprising a layer of chromium 33 and an overlayer of gold 34 are applied to the lightly doped n-type regions to form respectively the gate of the MESFET and the Schottky contacts of the diode. This layer also overlays the ohmic contacts to help to reduce the spreading resistance. Layers 33 and 34 are also deposited over the non implanted areas to form interconnection tracks and microwave passive components such as: filters, couplers and transmission lines.

The structure of the Schottky diode is shown in FIG. 5. As can be seen the ohmic contact 21 and the Schottky contact 25 are disposed adjacent each other on the semiconductor substrate. Advantageously the edges of the contacts are provided with an interdigitated finger structure. This has the effect of breaking the diode structure into a plurality of parallel connected smaller diodes thus significantly reducing the parasitic shunt capacitance of the device. Typically the diode structure comprises as many as 10 of these smaller diodes, each being about 1 micron by 2 microns in size. Since the buried $n^+$-type layer providing the current path through the diode has a relatively high conductivity the series resistance of the diode is also reduced thus allowing operation at high frequencies.

Although the foregoing description relates to the fabrication of the diode structure as part of an integrated circuit, it will be appreciated that the diode can also be fabricated as a discrete compound. Also, whilst gallium arsenide is the preferred material, other compound semiconductors can also be employed.

In a particularly advantageous embodiment of the invention the substrate 11 is provided with a thin, typically 300 to 500 Angstroms and preferably 400 Angstrom, surface layer of titanium (not shown). The photo resist mask 12 is then formed on top of this layer. The purpose of the titanium layer is to prevent any contamination that may result from the contact of the mask 12 with the semiconductor surface. Typically the titanium layer is deposited by evaporation and is removed after the implantation stages by conventional wet etching.

We claim:

1. A millimeter wave frequency integrated circuit comprising a Schottky field effect transistor (MESFET) and a Schottky diode structure including a plurality of diodes formed in a compound semiconductor substrate, the MESFET of said circuit including first and second deep layers of $n^+$ type material separated by a first surface layer of lightly doped n-type material, a Schottky gate contact disposed on said first surface layer, and first and second ohmic contacts connected directly to said first and second deep layers respectively to form the source and the drain contacts of the MESFET, and each said diode including a third deep layer of $n^+$-type material overload by a second surface layer of lightly doped n-type material, a Schottky diode contact disposed on said second surface layer, and a third ohmic contact connected directly to said third deep layer, said Schottky diode contacts and said third ohmic contacts being arranged in an interdigited finger structure for connecting said diodes in parallel.

2. A Schottky diode structure including a plurality of diodes formed in a compound semiconductor substrate, each diode including a deep layer of $n^+$-type material overlaid by a surface layer of lightly doped n-type material, a Schottky contact disposed on said surface layer, and an ohmic contact connected directly to said deep layer, said Schottky contacts and said ohmic contacts being arranged in an interdigited finger structure for connecting said diodes in parallel.

3. A diode structure as claimed in claim 2, wherein said deep layer of each said diode comprises silicon ions.

4. A diode structure as claimed in claim 3, wherein said deep layer of each said diode has a doping level of $10^{18}$ to $2 \times 10^{18}$ atoms/cc.

5. A Schottky diode structure as defined in claim 2 wherein said Schottky contacts and said ohmic contacts lie in a common plane.

* * * * *